United States Patent
Tang et al.

(10) Patent No.: US 9,798,232 B2
(45) Date of Patent: Oct. 24, 2017

(54) MULTIPLE COPOLYMER SYSTEMS AS TEMPLATES FOR BLOCK COPOLYMER NANOLITHOGRAPHY

(71) Applicants: Chuanbing Tang, Columbia, SC (US); Christopher G. Hardy, Columbia, SC (US); Alper Nese, Columbia, SC (US); Jeffery Hayat, West Columbia, SC (US)

(72) Inventors: Chuanbing Tang, Columbia, SC (US); Christopher G. Hardy, Columbia, SC (US); Alper Nese, Columbia, SC (US); Jeffery Hayat, West Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 14/516,626

(22) Filed: Oct. 17, 2014

(65) Prior Publication Data

US 2015/0126691 A1    May 7, 2015

Related U.S. Application Data

(60) Provisional application No. 61/962,461, filed on Nov. 7, 2013.

(51) Int. Cl.

| | |
|---|---|
| *C08F 287/00* | (2006.01) |
| *G03F 7/00* | (2006.01) |
| *C08F 293/00* | (2006.01) |
| *C08G 61/08* | (2006.01) |
| *C08L 65/00* | (2006.01) |
| *C08G 65/332* | (2006.01) |
| *B82Y 40/00* | (2011.01) |

(52) U.S. Cl.
CPC ........ *G03F 7/0002* (2013.01); *C08F 293/005* (2013.01); *C08G 61/08* (2013.01); *C08G 65/3322* (2013.01); *C08L 65/00* (2013.01); *B82Y 40/00* (2013.01); *C08F 2438/01* (2013.01); *C08G 2261/126* (2013.01); *C08G 2261/1426* (2013.01); *C08G 2261/3324* (2013.01); *C08G 2261/418* (2013.01); *C08G 2261/74* (2013.01)

(58) Field of Classification Search
CPC ........ C08F 8/00; C08F 287/00; C08F 285/00; C08F 293/005; C08F 2438/01; C08F 2261/74; C08L 65/00; C08G 2261/126
See application file for complete search history.

(56) References Cited

U.S. PATENT DOCUMENTS

| | | | | |
|---|---|---|---|---|
| 2006/0100305 | A1* | 5/2006 | Ma | C08F 265/04 523/160 |
| 2010/0261808 | A1* | 10/2010 | Schadler | B82Y 30/00 523/205 |

OTHER PUBLICATIONS

Börner, H.G. et al. Macromolecules vol. 34 pp. 4375-4383 (May 17, 2001).*
Pang, X. et al. Macromolecules vol. 44 pp. 3746-3752 (Apr. 28, 2011).*
Stöhr, T. et al. Macromolecules vol. 33 pp. 4501-4511 (Jun. 13, 200).*
Lu W, Lieber CM. Nanoelectronics from the bottom up. Nat Mater. 2007;6:841-50.
Kim H-C, Park S-M, Hinsberg WD. Block Copolymer Based Nanostructures: Materials, Processes, and Applications to Electronics. Chemical Reviews. 2009;110:146-77.
Park M, Harrison C, Chaikin PM, Register RA, Adamson DH. Block Copolymer Lithography: Periodic Arrays of ~1011 Holes in 1 Square Centimeter. Science. 1997;276:1401-4.
Bates FS, Fredrickson GH. Block Copolymers—Designer Soft Materials. Phys Today. 1999;52:32-8.
Stoykovich MP, Müller M, Kim SO, Solak HH, Edwards EW, de Pablo JJ, et al. Directed Assembly of Block Copolymer Blends into Nonregular Device-Oriented Structures. Science. 2005;308:1442-6.
Bang J, Kim SH, Drockenmuller E, Misner MJ, Russell TP, Hawker CJ. Defect-Free Nanoporous Thin Films from ABC Triblock Copolymers. Journal of the American Chemical Society. 2006;128:7622-9.
Kim SH, Misner MJ, Russell TP. Solvent-Induced Ordering in Thin Film Diblock Copolymer/Homopolymer Mixtures. Advanced Materials. 2004;16:2119-23.
Hadjichristidis N, Pispas S, Floudas G. Block Copolymers: Synthetic Strategies, Physical Properties, and Applications. Hoboken, NJ: Wiley; 2003.
Xu J, Hong SW, Gu W, Lee KY, Kuo DS, Xiao S, et al. Fabrication of Silicon Oxide Nanodots with an Areal Density Beyond 1 Teradots Inch-2. Advanced Materials. 2011;23:5755-61.
Park S, Lee DH, Xu J, Kim B, Hong SW, Jeong U, et al. Macroscopic 10-Terabit-per-Square-Inch Arrays from Block Copolymers with Lateral Order. Science. 2009;323:1030-3.
Hardy CG, Ren L, Ma S, Tang C. Self-assembly of well-defined ferrocene triblock copolymers and their template synthesis of ordered iron oxide nanoparticles. Chemical Communications. 2013;49:4373-5.
Chuang VP, Gwyther J, Mickiewicz RA, Manners I, Ross CA. Templated Self-Assembly of Square Symmetry Arrays from an ABC Triblock Terpolymer. Nano Letters. 2009;9:4364-9.
Tang C, Lennon EM, Fredrickson GH, Kramer EJ, Hawker CJ. Evolution of Block Copolymer Lithography to Highly Ordered Square Arrays. Science. 2008;322:429-32.

* cited by examiner

*Primary Examiner* — Irina S Zemel
*Assistant Examiner* — Jeffrey Lenihan
(74) *Attorney, Agent, or Firm* — Dority & Manning, PA

(57) ABSTRACT

Methods are generally provided for preparing a polymeric composition that includes a grafted block copolymer. Methods are also generally provided for preparing a polymeric composition that includes a star block copolymer prepared from a central core molecule that includes a plurality of attachment moieties. Methods are also generally provided for preparing a polymeric composition that includes a linear block copolymer. Block copolymers are also generally provided. Multi-segmented linear block copolymers are also generally provided.

4 Claims, 9 Drawing Sheets

MULTIPLE COPOLYMER SYSTEMS AS TEMPLATES FOR BLOCK COPOLYMER NANOLITHOGRAPHY

PRIORITY INFORMATION

The present application claims priority to U.S. Provisional Patent Application Ser. No. 61/962,461 titled "Multiple Copolymer Systems as Templates for Block Copolymer Nanolithography" of Tang, et al. filed on Nov. 7, 2013, the disclosure of which is incorporated by reference herein.

BACKGROUND

Block copolymers (BCPs) have been used to prepare highly ordered nanoscale domains upon self-assembly and can be utilized in the "bottom-up" fabrication of nanoengineered materials and devices. The molecular characteristics of block copolymers dictate the self-assembly process and are critical in the formation of well-defined nanostructures. Thermodynamic immiscibility between these chemically distinct blocks leads to a variety of ordered nanostructures with periodicity at the scale of 5-100 nm. These microphase separated structures are mostly dictated by three experimental parameters: the degree of polymerization (N), the volume fraction of the blocks (f), and the Flory-Huggins interaction parameter ($\chi$). The chemical nature of the block segments determines $\chi$, which in turn describes the segment-segment interactions. The emerging role of block copolymer lithography in the fabrication of various devices has led to significant challenges in the creation of small features with a high degree of order. Smaller feature size, uniform porous films, faster processing time, and long-range order are a few of the main requirements demanded by the nanotechnology industry as outlined in the International Technology Roadmap for Semiconductors. The feature sizes of self-assembled nanodomains is directly influenced by both the $\chi$ and molecular weight of block copolymers. Therefore, decreasing the molecular weight N would reduce feature sizes. However, there is a limit as to how low the molecular weight a linear block copolymer for a given copolymer system can be, before it passes the order-disorder transition (ODT) and is incapable of forming microphase separated assemblies. Equally, block copolymer systems with a high $\chi$ can utilize lower molecular weight polymers before the ODT is reached. However, during the annealing phase, film instability occurs due to limited polymer chain entanglement. Long-range ordering in thin films has been achieved with A-B, A-B-A, A-B-C, or A-B/B'-C block copolymers. However, for all linear block copolymers, there exists vast film dewetting during annealing of low molecular weight systems.

SUMMARY

Objects and advantages of the invention will be set forth in part in the following description, or may be obvious from the description, or may be learned through practice of the invention.

Methods are generally provided for preparing a polymeric composition that includes a grafted block copolymer. In one embodiment, the method comprises: forming an A-B block copolymer, wherein a polymerizable group covalently attached to a terminal end of the A-B block copolymer; and thereafter, polymerizing the polymerizable group to form a grafted backbone polymer such that a plurality of the A-B block copolymers extend from the grafted backbone polymer to form the grafted block copolymer.

Methods are also generally provided for preparing a polymeric composition that includes a star block copolymer prepared from a central core molecule that includes a plurality of attachment moieties. In one embodiment, the method comprises: polymerizing a first monomer to form an A block covalently attached to each attachment moieties on the central core molecule, wherein the A block defines a terminal end; and polymerizing a second monomer on the terminal end of the A block to form a B block covalently attached to the A block.

Methods are also generally provided for preparing a polymeric composition that includes a linear block copolymer. In one embodiment, the method comprises: providing a linking molecule defining a pair of attachment moieties; polymerizing a first monomer to form a pair of A blocks covalently attached to each attachment moiety on the linking molecule, wherein each A block defines a terminal end; and polymerizing a second monomer on the terminal end of the A block to form a B block covalently attached to the A block.

Block copolymers are also generally provided. In one embodiment, the block copolymer comprises: a central core molecule covalently attached to a plurality of side chains, wherein each side chain comprises an A-B block copolymer.

Multi-segmented linear block copolymers are also generally provided. In one embodiment, the block copolymer comprises: a plurality of linking molecules, each linking molecule defining a pair of attachment moieties; and a plurality of -A-B-A- block copolymer chains covalently linking each linking molecule, wherein the -A-B-A- block copolymer chains define a B block positioned between a pair of A blocks, and wherein each A block is covalently linked to one of the linking molecules.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

DEFINITIONS

Figure 1:
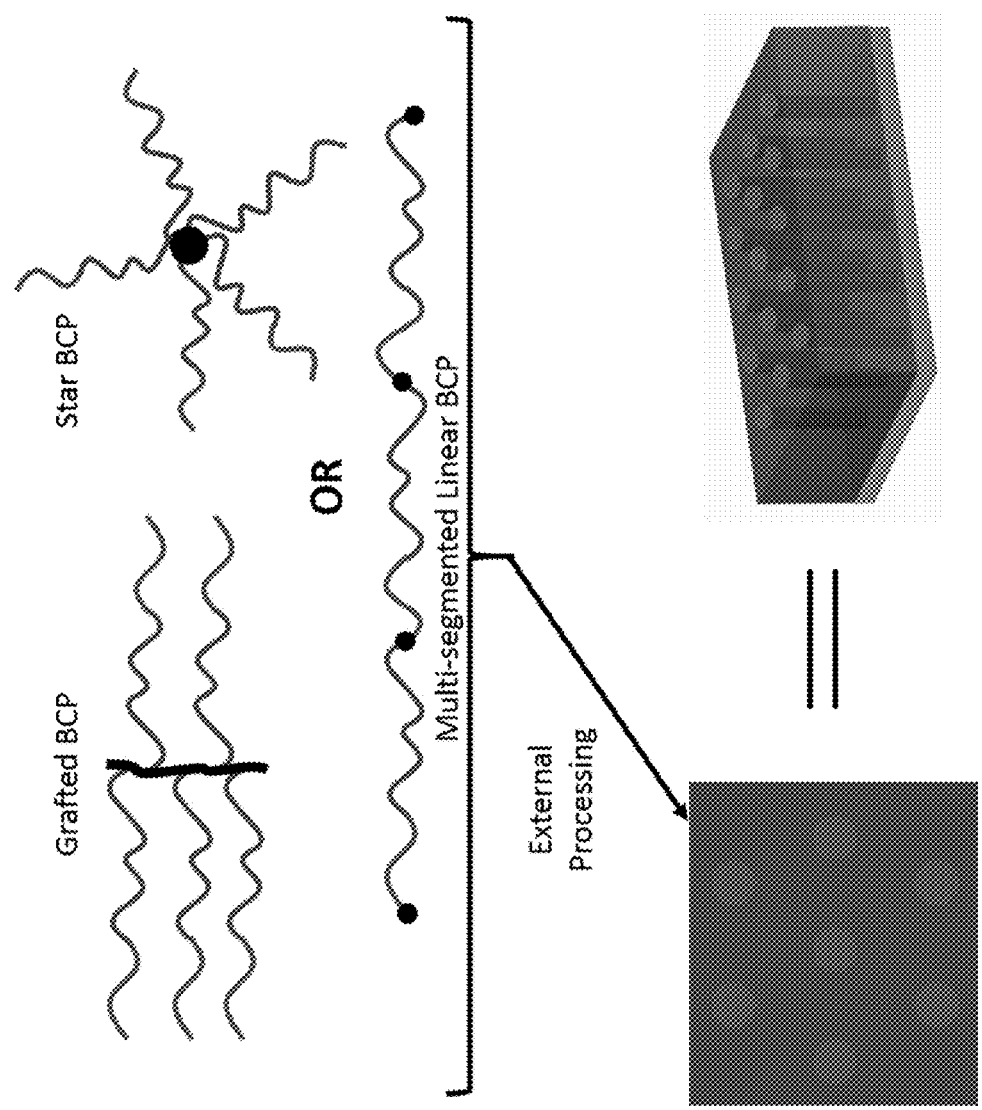
FIG. 1 shows a general schematic for microphase separation of grafted, star, and multi-segmented linear block copolymers.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, the prefix "nano" refers generally to the nanometer scale (e.g., from about 1 nm to about 999 nm), and in most instances to the range of about 1 nm to about 100 nm. For example, particles having an average diameter on the nanometer scale (e.g., from about 1 nm to about 999 nm, more particularly about 1 nm to about 100 nm) are referred to as "nanoparticles." Particles having an average diameter of greater than 1,000 nm (i.e., 1 µm) are generally referred to as "microparticles," since the micrometer scale generally involves those materials having an average size of greater than 1 µm.

As used herein, the term "polymer" generally includes, but is not limited to, homopolymers; copolymers, such as, for example, block, graft, random and alternating copolymers; and terpolymers; and blends and modifications thereof. Furthermore, unless otherwise specifically limited, the term "polymer" shall include all possible geometrical configurations of the material. These configurations include, but are not limited to isotactic, syndiotactic, and random configurations.

The term "organic" is used herein to refer to a class of chemical compounds that are composed of carbon atoms. For example, an "organic polymer" is a polymer that includes carbon atoms in the polymer backbone, but may also include other atoms either in the polymer backbone and/or in side chains extending from the polymer backbone (e.g., oxygen, nitrogen, sulfur, etc.).

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present disclosure is directed to polymeric compositions and their methods of preparation. The polymeric compositions disclosed herein are particularly suitable for applications in nanolithography, comprising grafted, star, and multi-segmented block copolymers, where: (i) the brush, arm, or repeating unit comprises diblock copolymers for the grafted, star, and multi-segmented block copolymers, respectively; (ii) the composition exhibits a microphase-separated morphology with A and B domains comprised of A and B blocks. Long-range ordering of nanometer-scale domain features has been achieved in thin films of such grafted, star, and multi-segmented block copolymers, while avoiding film instability such as dewetting, especially for low molecular weight systems.

The methods disclosed herein can provide a broad strategy that allows for the development of polymeric compositions for nanolithography comprising of grafted block copolymers, star block copolymers, and multi-segmented linear block copolymers with a controlled microphase separated structure with high film quality. As the block copolymers on the side-chain of the grafted block copolymer or arm of the star block copolymer contain most of the volume fraction (i.e., greater than 90%) of the polymer system and the multi-segmented linear block copolymer exists in an A-B or A-B-A linear copolymer form, these copolymer systems exhibit microphase separation similar to linear A-B diblock and A-B-A triblock copolymers, and thus, compositions, morphologies, and predications of well-studied linear block copolymers can be utilized. Since these grafted, star, and multi-segmented block copolymers are linked with at least one end by a common polymer backbone, film instability is significantly decreased during the annealing stage due to increased chain entanglement of adjacent polymer chains. The grafted side-chains, star arms, and multi-segmented block copolymer repeat units can be linked at the polymer chain-end(s) by a variety of interactions, including covalent bonds (e.g. polyolefins, polynorbornenes, etc.), hydrogen bonding (e.g. complexation between terminal carbonyl and amide groups), ion pairs (e.g. complexation between terminal acid and amino groups), metal coordination (e.g. complexation between terminal terpyridine groups through a metal bridging atom), nanoparticles (e.g. silica), etc.

In one embodiment, the presently described methods can provide a new approach to develop self-assembled nanoscale patterns for use in nanolithography. The invention provides access to the diverse morphologies that linear A-B diblock and A-B-A triblock copolymers offer, yet is capable of using lower molecular weight polymer side-chains without detrimental film dewetting. Successful utilization of such nanolithography techniques will enable "bottom-up" fabrication of nanoengineered materials and devices.

In certain embodiments, methods are provided for preparing a polymeric composition, comprising grafted block copolymer, star block copolymer, and multi-segmented linear block copolymer systems with side-chain, arm, and repeat units containing A-B diblock copolymers chains, respectively, wherein:

(i) said grafted block copolymer itself contains A-B diblock copolymers on the side-chain;

(ii) said star block copolymer itself contains A-B diblock copolymers as arms extruding from a central core;

(iii) said multi-segment linear block copolymer itself contains A-B block copolymers as repeat units in the polymer backbone;

(iv) the polymer side-chains (grafted BCP), arms (star BCP), or repeat units (multi-segmented BCP) are linked at the polymer chain end(s) through an attractive force including covalent bonds, hydrogen bonds, ionic bonds, ion pairs, metal-ligand interactions, or nanoparticles; and (v) the composition exhibits a microphase-separated morphology with distinct minority domains and matrix comprised largely of A and B polymer segments.

In specific embodiments, the blocks A and B can each bear a group selected from olefins, conjugated dienes, methacrylates, styrenes, acrylates, acrylamides, and acrylonitriles, esters, ethers, urethanes, ureas, amides, and statistical copolymers thereof. In another embodiment, the polymer backbone (grafted BCP), core (star BCP), or linker (multi-segmented BCP) bear the functional groups responsible for the attractive interaction between side-chain units including covalent bonds, hydrogen bonds, ionic bonds, ion pairs, metal-ligand interactions, or nanoparticles.

Thin films of these block copolymer systems can be treated so as to achieve long-range orientational and positional ordering of microdomains at a macroscopic scale. Given the diverse set of morphologies that can be achieved with decreased feature sizes, this method significantly broadens the scope of block copolymer lithography.

A. Grafted Block Copolymers

As shown in FIG. 1, a grafted block copolymer can be prepared by forming an A-B block copolymer that has a polymerizable group covalently attached to one of its terminal ends. Then, the polymerizable group can be polymerized to form a grafted backbone polymer such that a plurality of the A-B block copolymers extend from the grafted backbone polymer to form the grafted block copolymer. The resulting grafted block copolymer is thus formed from a central core molecule (defined by the backbone polymer) that is covalently attached to a plurality of side chains (defined by the A-B block copolymer).

B. Star Block Copolymers

Also shown in FIG. 1, a star block copolymer can be prepared from a central core molecule that includes a plurality of attachment moieties by polymerizing a first monomer (i.e., monomer "A") to form an A block that is covalently attached to each attachment moiety. The A block defines a terminal end. Then, a second monomer (i.e., monomer "B") polymerized on the terminal end of the A block to form a B block covalently attached to the A block. The resulting star block copolymer includes central core molecule covalently attached to a plurality of side chains (defined by the A-B block copolymer).

C. Linear Block Copolymers

Also as shown in FIG. 1, a multi-segmented, linear block copolymer can be prepared from a plurality of linking molecules that each defines a pair of attachment moieties. A first monomer (i.e., monomer "A") is first polymerized to form a pair of A blocks covalently attached to each attachment moiety on the linking molecule, Each A block defines a terminal end. Then, a second monomer (i.e., monomer "B") is polymerized on the terminal end of the A block to form a B block covalently attached to the A block. The resulting linear block copolymer includes a linking molecule covalently attached to two side chains (each defined by the A-B block copolymer).

In one embodiment, the B block covalently links terminal ends of two A blocks such that to linking molecules are covalently linked through an -A-B-A- block copolymer chain.

EXAMPLES

A novel route has been demonstrated that allows the utilization of grafted block copolymers, star block copolymers, and multi-segmented linear block copolymers to avoid macrophase separation and achieve long-range ordering in thin films with feature sizes unobtainable for the linear diblock copolymer analogues. Self-assembly of these systems leads to arrays of highly ordered microphase separated structures which are typical for linear diblock copolymers, such as microdomain arrays of cylinders with hexagonal packing and spheres with body centered cubic packing. This system can be used as a lithographic mask to achieve ordered nanopillars or nanopores with preservation of its precursor structures. The size of the ordered features is primarily in the range of 5-20 nm but can be larger or smaller. The novel method involves a polymeric composition comprising of grafted, star, and multi-segmented block copolymers, specifically, A-B block copolymers linked by a common polymer backbone (grafted BCP), a core (star BCP), or linkers (multi-segmented BCP) with a microphase-separated, two-domain structure in which the A and B blocks on the polymer side-chain form individual domains with the polymer backbone (grafted BCP), core (star BCP), or linkers (multi-segmented BCP) positioned within either the A or B domain. For example, FIG. 1 illustrates a scheme for the three block copolymer systems (grafted BCP, star BCP, or multi-segmented linear BCP) utilized in preparing arrays of hexagonally packed cylinders.

These block copolymer systems provide access to the microphase structures of A-B diblock and A-B-A triblock copolymers, thus having the advantage of various morphologies, while surpassing the lower limit of feature sizes obtainable by A-B diblock and A-B-A triblock copolymers. The grafted, star, and multi-segmented linear diblock copolymer systems utilize linking component A-B diblock copolymers as brushes (grafted BCP), arms (star BCP), and repeat units (multi-segmented linear BCP) to avoid dewetting during processing by offering increased chain entanglement due to the confinement of the component block copolymers to a common backbone (grafted BCP and multi-segmented BCP) or central core (star BCP). The method presented in this invention offers the following key features:

1. Linear A-B diblock copolymers are confined to the side-chain in a grafted BCP, arms in a star BCP, or as repeat units in a multi-segmented BCP.

2. The copolymer systems microphase separate with
  a. A domains comprised largely of A block segments;
  b. B domains comprised largely of B block segments; and 3. Film instability of the copolymers is avoided due to linking the component A-B diblock copolymers to a common polymer backbone (grafted BCP and multi-segmented BCP) or a central core (star BCP).

An example of such systems are described below.

Example 1a: Synthesis

Figure 2:
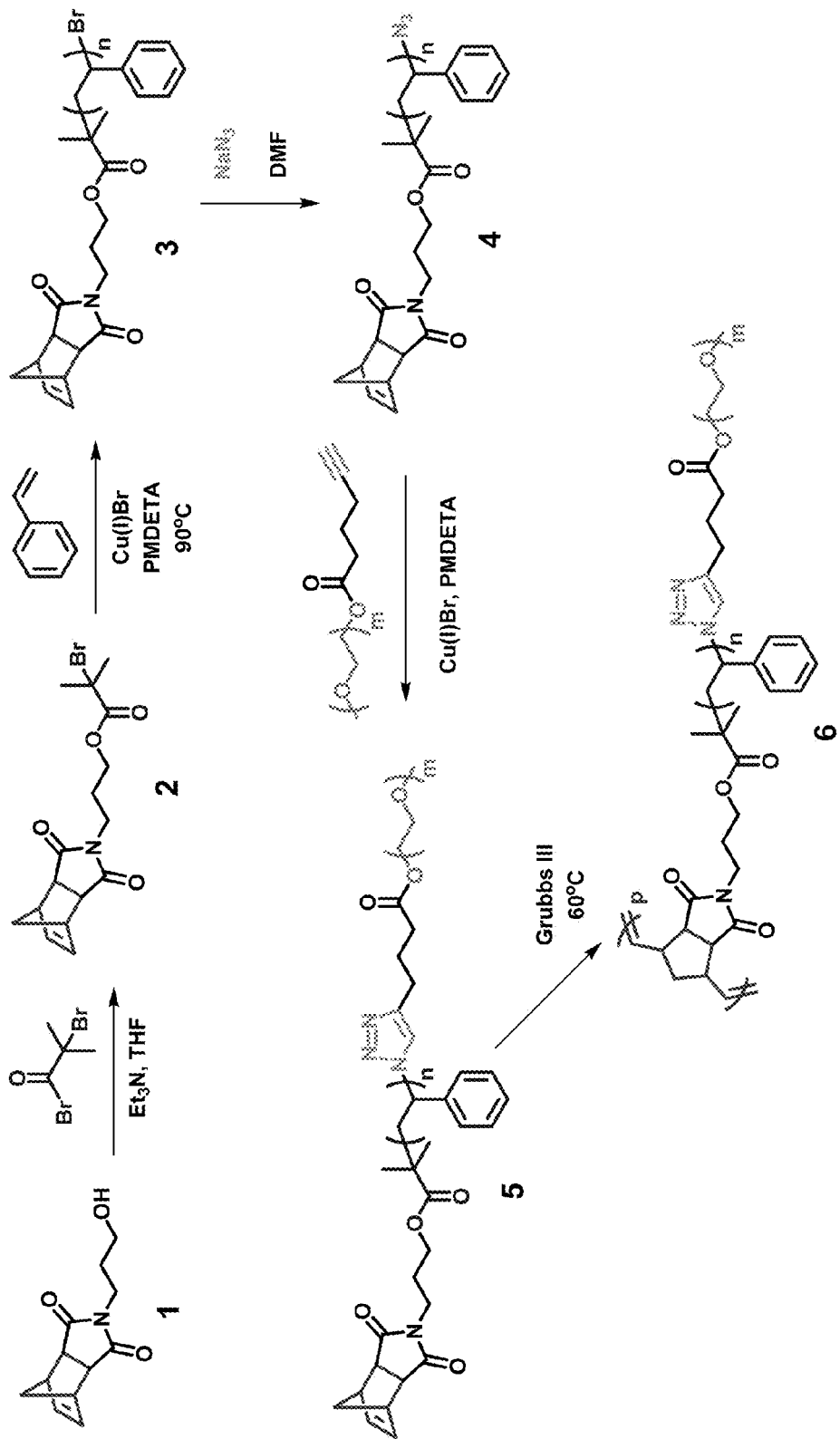
FIG. 2 shows an exemplary reaction synthesis of grafted block copolymer PNB-g-(PS-b-PEO)).

Grafted block copolymer poly(norbornene-g-(poly(styrene)-b-poly(ethylene oxide)) (PNB-g-(PS-b-PEO)) was prepared in order to illustrate one embodiment of the invention. This grafted block copolymer system combined the readily-achievable long-range order offered by PEO segments in PS-PEO diblock copolymers with the enhanced chain entanglement offered from a grafted block copolymer system. The side-chains consisted of diblock copolymers PS-PEO that are linked at the end of the PS block by a poly(norbornene) backbone. The synthesis of PNB-g-(PS-b-PEO) was accomplished as shown in FIG. 2 by atom transfer radical polymerization (ATRP), an alkyne-azide cycloaddition "click" reaction, and ring-opening metathesis polymerization (ROMP), respectively. An alcohol functionalized exo-norbornene (1) was reacted with bromoisobutryl bromide to prepare compound 2, which contains both an ATRP initiating site and a ROMP polymerizable norbornene moiety. Styrene was polymerized from the initiator 2 resulting with polymer 3, which contains terminal norbornene and bromine units. The terminal bromine was converted into a terminal azide by reaction with sodium azide, resulting in polymer 4. An alkyne-azide cycloaddition "click" reaction between the terminal azide of polymer 4 and an alkyne-modified PEO resulted in diblock copolymer 5. The terminal norbornene unit of diblock copolymer 5 was polymerized via ROMP, resulting in grafted block copolymer 6.

Example 1b: Thin Film Processing

Figure 3A:
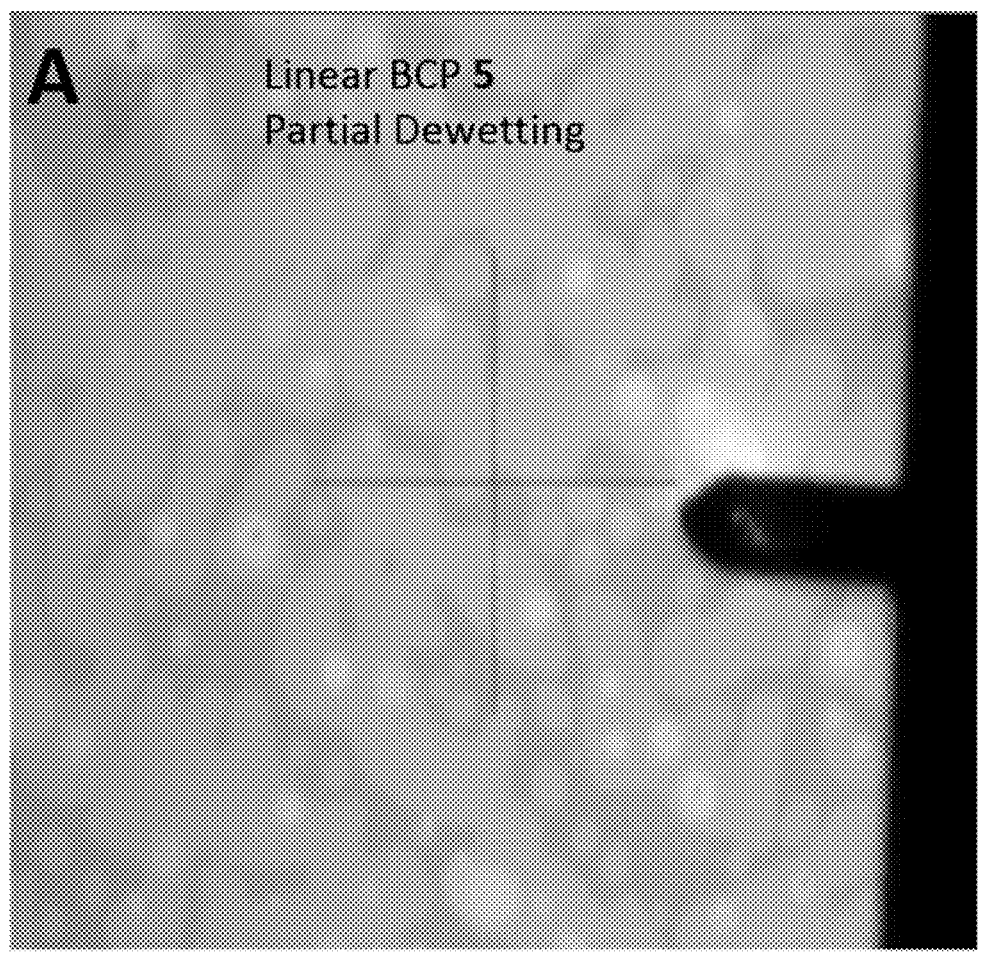
FIG. 3A shows an optical image of linear diblock copolymer 5 after solvent annealing.
Figure 3B:
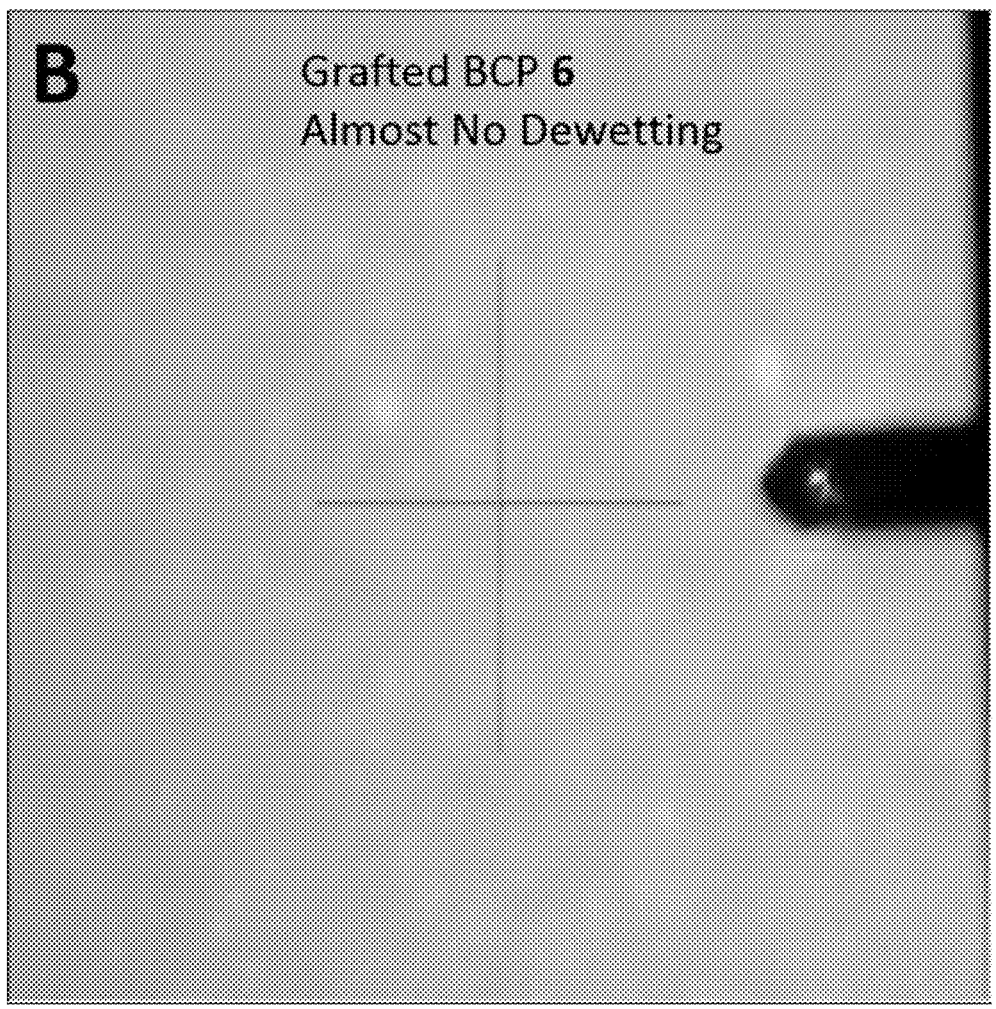
FIG. 3B shows an optical image of grafted block copolymer 6 after solvent annealing.
Figure 4A:
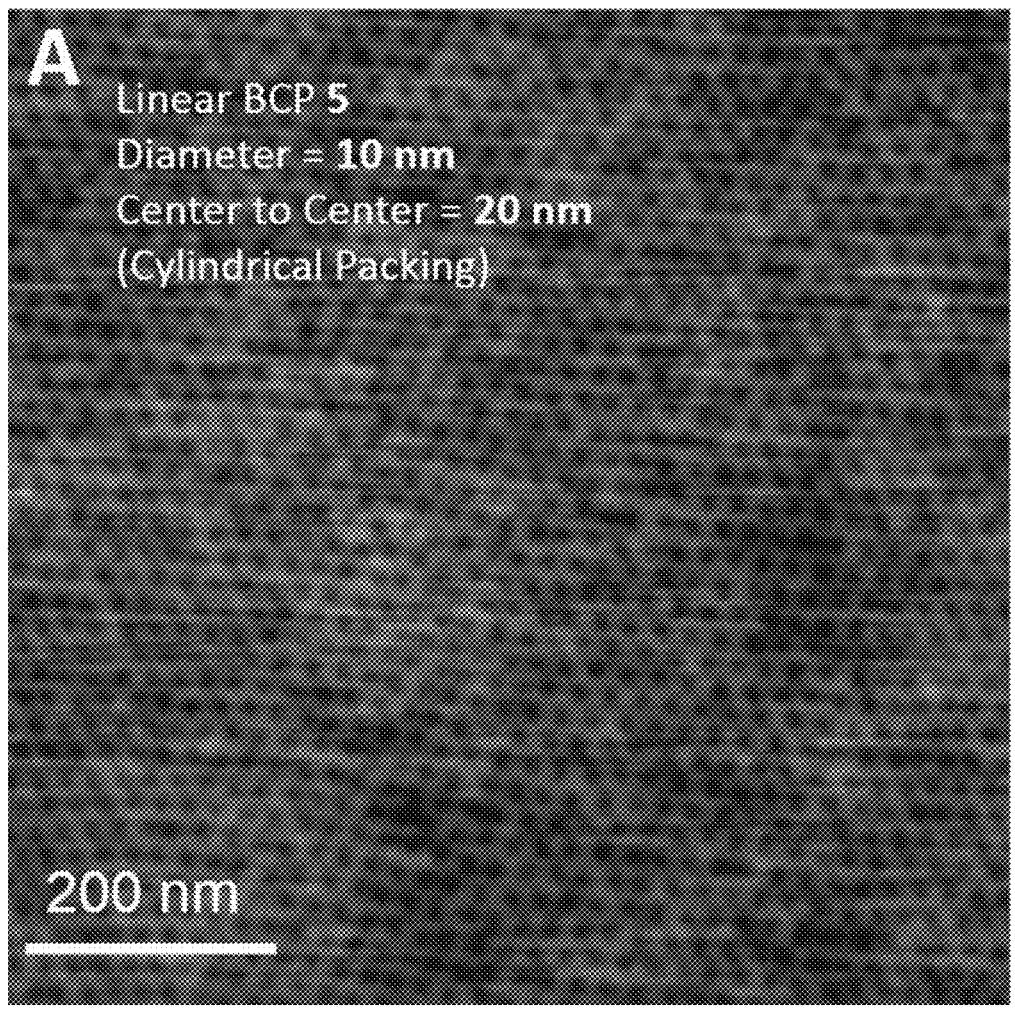
FIG. 4A shows a microphase separation of linear diblock copolymer 5 after solvent annealing.
Figure 4B:
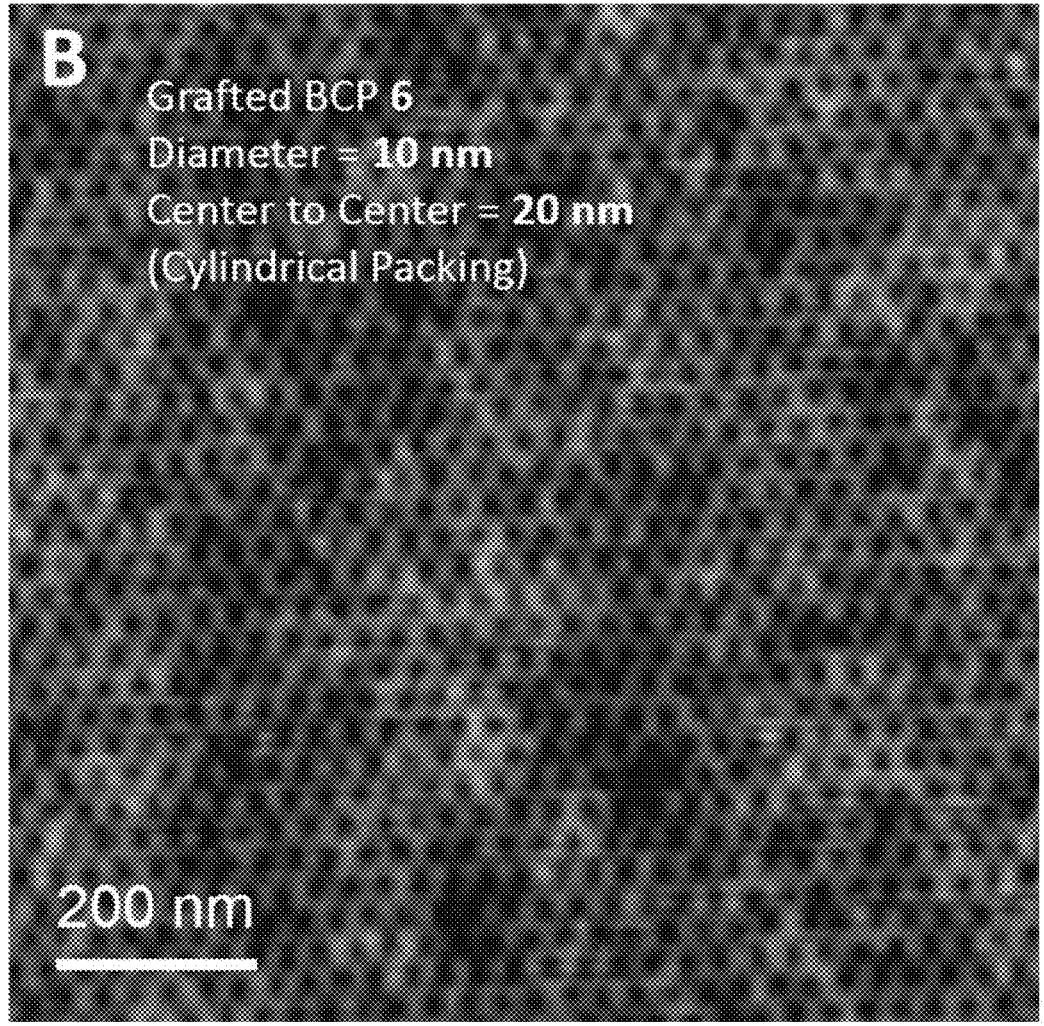
FIG. 4B shows a microphase separation of grafted block copolymer 6 after solvent annealing.

High-humidity solvent annealing is a technique that can be utilized to achieve long-range ordering of PS-PEO based block copolymers. The above linear diblock copolymer 5 and grafted block copolymer 6 were dissolved in toluene and then spin-coated onto silicon wafers followed by solvent annealing under controlled humidity. Partial film dewetting was observed for linear diblock copolymer 5 while no film dewetting was observed form grafted block copolymer 6, as seen in FIG. 3. FIG. 4 shows the formation of hexagonally-packed cylinders of PEO within a matrix of PS for linear diblock copolymer 5 (FIG. 4A) and grafted block copolymer 6 (FIG. 4B). The cylinders align perpendicular to the substrate and the film surface and span the whole wafer. By controlling the molecular weight of each block, the size of the ordered domains can be tuned between 5-100 nm.

This work shows the potential for many other block copolymer systems to be applied in a similar fashion to obtain ordered films. Among many possible functional groups, polymers bearing the following groups are particularly attractive: olefins, conjugated dienes, methacrylates, styrenes, acrylates, acrylamides, and acrylonitriles. In all of these cases, grafted, star, and multi-segmented linear block copolymer systems utilize linking component A-B diblock copolymers as brushes (grafted BCP), arms (star BCP), and repeat units (multi-segmented linear BCP) to avoid dewetting during processing by offering increased chain entanglement. Additional processing techniques, such as thermal annealing, neutral surfaces, chemical modified substrates, and graphoepitaxy, can be applied to improve the quality of the lateral in-plane order of the microdomains, the details of which depend on the type of polymers chosen.

Example 2a: Synthesis

Figure 5:
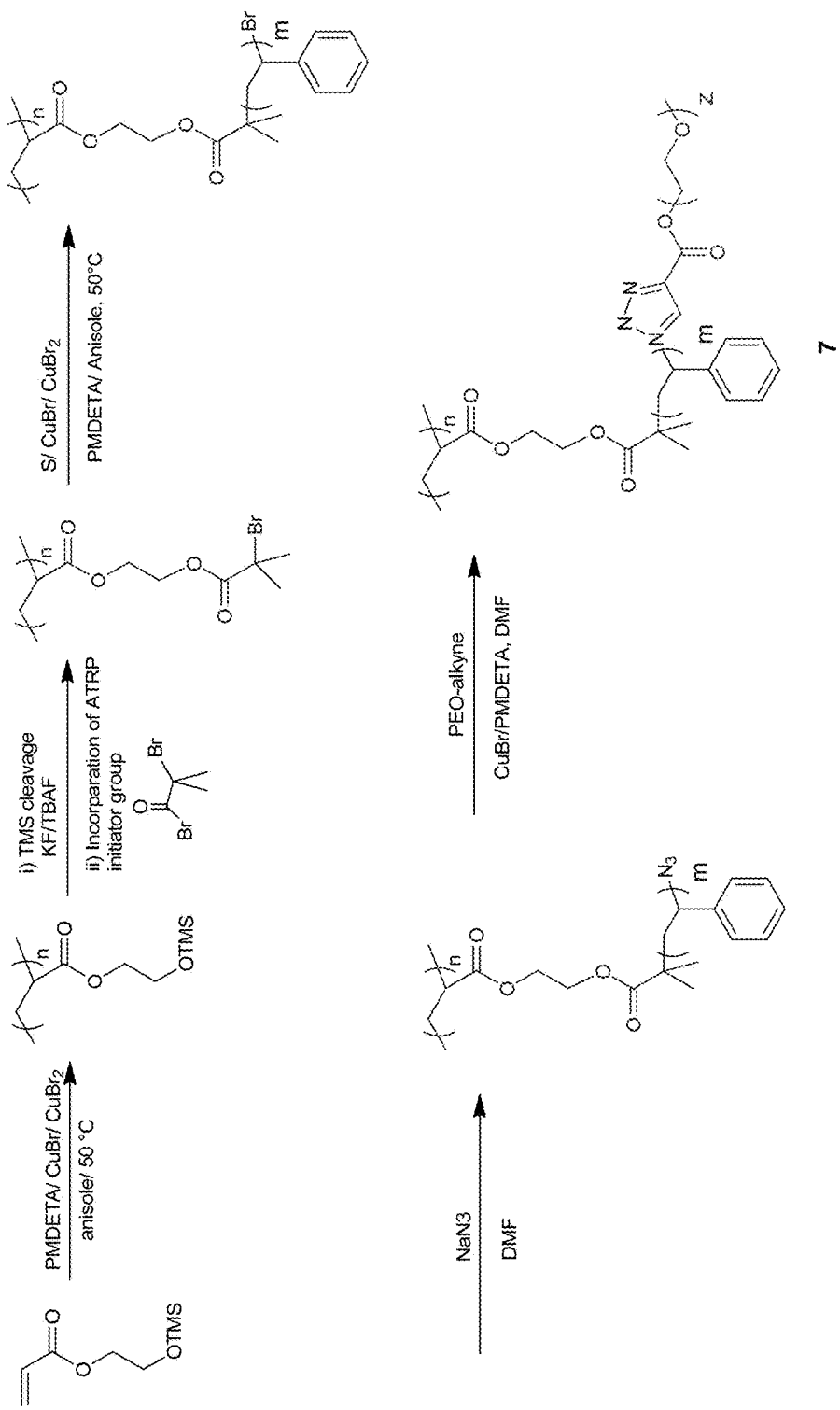
FIG. 5 shows an exemplary reaction synthesis of star shaped block copolymer (PBiBEA-g-(PS-b-PEO)).

A star shaped graft copolymer, poly(2-bromoisobutyryloxyethyl acrylate-g-[poly(styrene)-b-poly(ethylene oxide)] (PBiBEA-g-(PS-b-PEO), 7) was prepared to realize one embodiment (FIG. 5). Trimethylsilyl protected hydroxyethyl acrylate was polymerized by ATRP and subsequently functionalized by esterification reaction to incorporate terminal —Br atoms giving PBiBEA backbone. PBiBEA was used as oligomeric macroinitiators to polymerize S by ATRP. Next, —Br chains ends were replaced by azide groups to be clicked with PEO with alkyne chain end functionality.

Example 2b: Thin Film Processing

Figure 6:
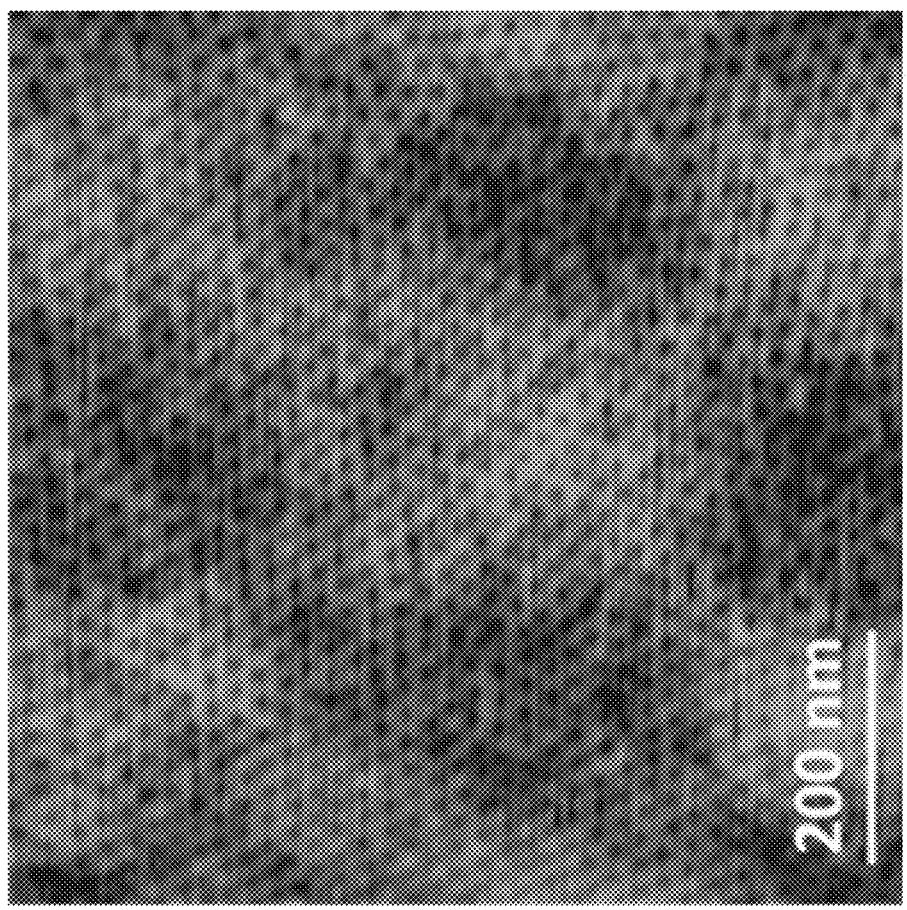
FIG. 6 shows a microphase separation of star shaped diblock copolymer after solvent annealing.

FIG. 6 shows the formation of hexagonally-packed cylinders of PEO within a matrix of PS for star shaped diblock copolymer 7. The cylinders align perpendicular to the substrate and the film surface and span the whole wafer. By controlling the molecular weight of each block, the size of the ordered domains can be tuned between 5-100 nm.

Example 3a: Synthesis

Figure 7:
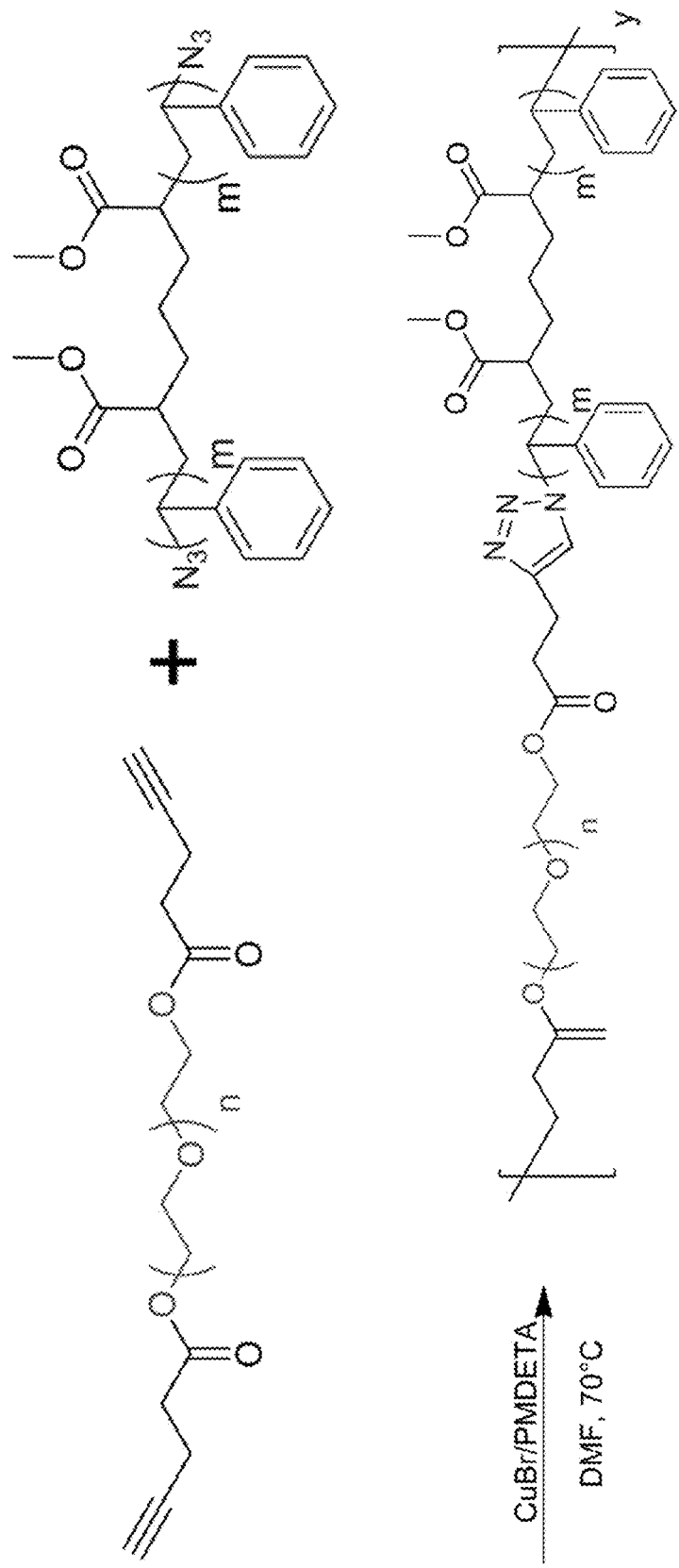
FIG. 7 shows an exemplary reaction synthesis of a multi-segmented block copolymer.

A segmented A-B type block copolymer, poly[poly(styrene)-b-poly(ethylene oxide)] P(PS-b-PEO)) were prepared to realize the invention (FIG. 7). An esterification reaction was used to incorporate alkyne functionality to the both chains ends of PEO to be used for click reaction with PS having azide functionality at its both chain ends. PS was prepared via ATRP by using a difunctional ATRP initiator. Terminal —Br atoms were replaced by azide to allow click chemistry with dialkyne PEO. Click reaction of dialkyne PEO and diazide PS proceeded via step growth polymerization mechanism and provided segmented bock copolymers. Such architecture readily allows having high molecular weight A-B type block copolymers by still keeping the sub-block molecular weights low.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A block copolymer, comprising: a central core molecule covalently attached to a plurality of side chains, wherein each side chain comprises an A-B block copolymer, wherein the A-B block copolymer includes a first block comprising styrene and a second block comprising polyethylene oxide, wherein the A-B block copolymer comprises greater than 90% of the volume fraction of the block copolymer.

2. The block copolymer of claim 1, wherein the central core molecule is a backbone polymer.

3. The block copolymer of claim 1, wherein the side chains form a non-covalent linkage with other side chains to form a polymeric composition.

4. The block copolymer of claim 3, wherein the non-covalent linkages comprise hydrogen bonding, ionic bonding, ion pairing, or metal-ligand interactions.

* * * * *